United States Patent
Meinhardt et al.

(10) Patent No.: US 11,923,467 B2
(45) Date of Patent: Mar. 5, 2024

(54) SEMICONDUCTOR DEVICE FOR INFRARED DETECTION, METHOD OF MANUFACTURING SEMICONDUCTOR DEVICE FOR INFRARED DETECTION AND INFRARED DETECTOR

(71) Applicant: ams AG, Premstätten (AT)

(72) Inventors: Gerald Meinhardt, Premstätten (AT); Ingrid Jonak-Auer, Premstätten (AT); Gernot Fasching, Premstätten (AT); Bernhard Löffler, Premstätten (AT)

(73) Assignee: AMS AG, Premstätten (AT)

( * ) Notice: Subject to any disclaimer, the term of this patent is extended or adjusted under 35 U.S.C. 154(b) by 0 days.

(21) Appl. No.: 17/620,059

(22) PCT Filed: Jun. 4, 2020

(86) PCT No.: PCT/EP2020/065454
§ 371 (c)(1),
(2) Date: Dec. 16, 2021

(87) PCT Pub. No.: WO2020/254119
PCT Pub. Date: Dec. 24, 2020

(65) Prior Publication Data
US 2022/0310857 A1 Sep. 29, 2022

(30) Foreign Application Priority Data
Jun. 18, 2019 (EP) .................................. 19180949

(51) Int. Cl.
*H01L 31/0232* (2014.01)
*H01L 31/02* (2006.01)
(Continued)

(52) U.S. Cl.
CPC .. *H01L 31/02327* (2013.01); *H01L 31/02019* (2013.01); *H01L 31/0312* (2013.01); *H01L 31/1812* (2013.01)

(58) Field of Classification Search
CPC ......... H01L 31/02327; H01L 31/02019; H01L 31/0312; H01L 31/1812; H01L 31/028;
(Continued)

(56) References Cited

U.S. PATENT DOCUMENTS 5,517,589 A * 5/1996 Takeuchi ........ H01L 31/035236
257/E31.13
2002/0014643 A1 * 2/2002 Kubo .................. H01L 27/1443
257/E27.128
(Continued)

FOREIGN PATENT DOCUMENTS

| CN | 104769467 A | 7/2015 |
| CN | 106328751 A | 1/2017 |

(Continued)

OTHER PUBLICATIONS

S. E. Bisson, T. J. Kulp, O. Levi, J. S. Harris and M. M. Fejer, "Long-wave infrared chemical sensing based on orientation-patterned GaAs," Conference on Lasers and Electro-Optics, 2004. (CLEO)., San Francisco, CA, USA, 2004, pp. 3 pp. vol. 1. (Year: 2004).*

(Continued)

*Primary Examiner* — Sitaramarao S Yechuri
(74) *Attorney, Agent, or Firm* — MH2 TECHNOLOGY LAW GROUP LLP (57) ABSTRACT

A semiconductor device for infrared detection comprises a stack of a first semiconductor layer, a second semiconductor layer and an optical coupling layer. The first semiconductor layer has a first type of conductivity and the second semiconductor layer has a second type of conductivity. The (Continued)

optical coupling layer comprises an optical coupler and at least a first lateral absorber region. The optical coupler is configured to deflect incident light towards the first lateral absorber region. The first lateral absorber region comprises an absorber material with a bandgap Eg in the infrared, IR.

17 Claims, 4 Drawing Sheets

(51) Int. Cl.
*H01L 31/0312* (2006.01)
*H01L 31/18* (2006.01)

(58) Field of Classification Search
CPC ... H01L 31/109; G02B 6/102; G02B 6/12004; G02B 6/1228; G02B 6/34; G02B 2006/12061; G02B 2006/12123; G02B 2006/12107
See application file for complete search history.

(56) References Cited

U.S. PATENT DOCUMENTS

| | | | |
|---|---|---|---|
| 2005/0053347 A1 | 3/2005 | West et al. | |
| 2011/0012221 A1* | 1/2011 | Fujikata | H01L 31/022408 257/458 |
| 2011/0038588 A1 | 2/2011 | Kim et al. | |
| 2015/0028386 A1 | 1/2015 | Shi et al. | |
| 2015/0180210 A1* | 6/2015 | Yu | G02B 6/12004 438/24 |
| 2015/0293302 A1 | 10/2015 | Czornomaz et al. | |
| 2016/0161331 A1* | 6/2016 | Liu | A61B 5/1455 250/237 G |
| 2017/0052254 A1* | 2/2017 | Tateyama | G01S 15/8995 |
| 2017/0347086 A1* | 11/2017 | Watanabe | H04N 13/156 |
| 2020/0003613 A1 | 1/2020 | Bruyeck et al. | |

FOREIGN PATENT DOCUMENTS

| | | |
|---|---|---|
| CN | 106941779 A1 | 7/2017 |
| CN | 109461787 A | 3/2019 |
| CN | 109817730 A1 | 5/2019 |
| DE | 19515369 A1 | 11/1996 |
| JP | 861242070 A | 10/1986 |
| JP | S61242070 * | 10/1986 |
| WO | 2006123881 A1 | 11/2006 |

OTHER PUBLICATIONS

PCT International Search Report and Written Opinion dated Aug. 14, 2020, International Application No. PCT/EP2020/065454, pp. 1-17.

Chinese Office Action dated Jul. 8, 2023, Chinese Patent Application No. 202080044693.8, 15 pages, with English translation.

* cited by examiner

SEMICONDUCTOR DEVICE FOR INFRARED DETECTION, METHOD OF MANUFACTURING SEMICONDUCTOR DEVICE FOR INFRARED DETECTION AND INFRARED DETECTOR

CROSS-REFERENCE TO RELATED APPLICATIONS

The present application is the national stage entry of International Patent Application No. PCT/EP2020/065454, filed on Jun. 4, 2020, and published as WO 2020/254119 A1 on Dec. 24, 2020, which claims the benefit of priority of European Patent Application No. 19180949.0, filed on Jun. 18, 2019, the disclosures of all of which are incorporated by reference herein in their entirety.

FIELD OF THE INVENTION

The invention relates to the field of infrared photodetectors. Improved concepts are introduced that relate to a semiconductor device for infrared detection, a method of manufacturing semiconductor device for infrared detection and an infrared detector.

BACKGROUND OF THE INVENTION

Figure 5:
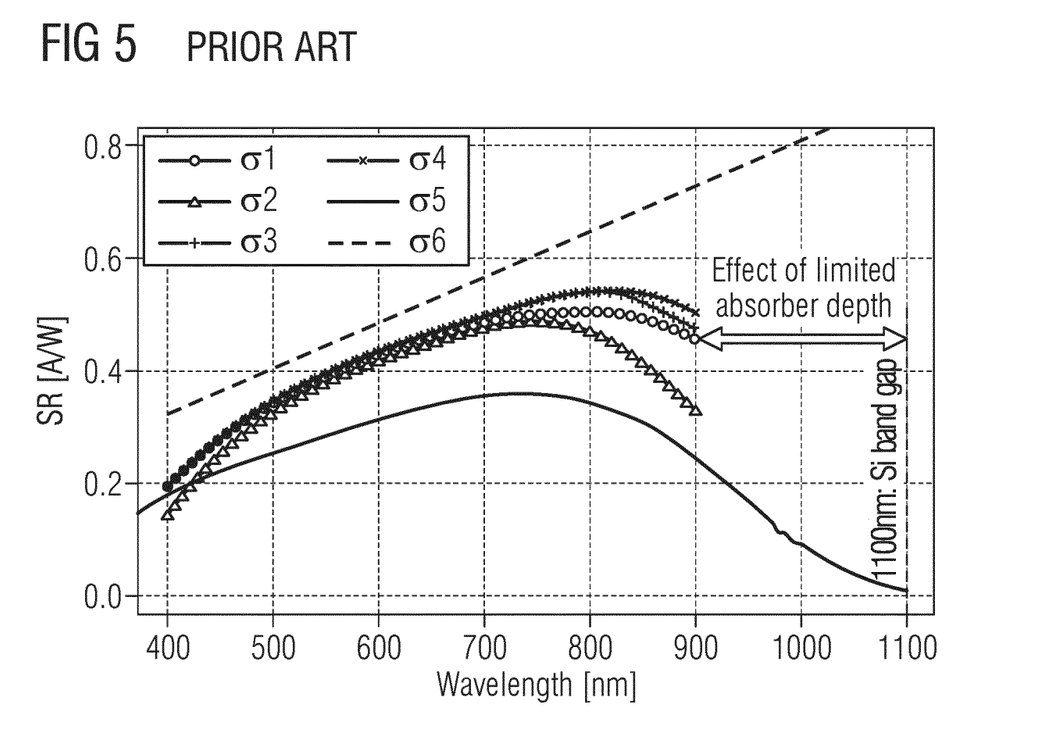
FIG. 5 shows examples of prior art silicon photodiodes with silicon epilayer of different thickness.

Conventional photodiodes, such as pn- or pin-photodiodes are based on a vertical layer stack (with respect to a wafer surface) of p-type, n-type, and/or intrinsic semiconductor layers to form anode, cathode and light absorber regions. Semiconductor materials, such as Silicon have an energy gap or bandgap, i.e. an energy range in a solid where no electron states can exist. For Silicon the bandgap is about Eg=1.1 eV. The bandgap generally refers to the energy difference (in electron volts) between the top of the valence band and the bottom of the conduction band in insulators and semiconductors. In other words, the bandgap indicates the energy required to promote a valence electron bound to an atom to become a conduction electron, which is free to move within the crystal lattice and serve as a charge carrier to conduct electric current. Photodiodes made from Silicon have a responsivity which is low or even equals zero for wavelengths higher than 1100 nm due to the bandgap at $E_g$=1.1 eV. Furthermore, conventional photodiode structure only provide a comparably small absorber thickness. Due to thin Absorber thickness in integrated photo diodes, however, the spectral responsivity is far below the theoretically possible limit of 0.89 A/W at 1100 nm (see FIG. 5). In FIG. 5 shows example spectral responsivities of integrated silicon PIN photodiode. For example, σ1 relates to an integrated photo diode homogeneous substrate, σ2 an integrated photo diode with EPI substrate (TEPI=20 μm), σ3 an integrated photo diode EPI substrate (TEPI=40 μm), σ4 an integrated photo diode EPI substrate (TEPI=60 μm), σ5 a commercial photo diode silicon, and σ6 indicates the theoretical limit of spectral responsivity.

It is an objective to provide a semiconductor device for infrared detection, a method of manufacturing a semiconductor device for infrared detection and an infrared detector which allow for increased sensitivity in the near infrared.

These objectives are achieved by the subject matter of the independent claims. Further developments and embodiments are described in dependent claims.

SUMMARY OF THE INVENTION

It is to be understood that any feature described in relation to any one embodiment may be used alone, or in combination with other features described herein, and may also be used in combination with one or more features of any other of the embodiments, or any combination of any other of the embodiments unless described as an alternative. Furthermore, equivalents and modifications not described below may also be employed without departing from the scope of the semiconductor device, the method of manufacturing a semiconductor device for infrared detection and the infrared detector which are defined in the accompanying claims.

The following relates to an improved concept in the field of semiconductor optoelectronic devices, e.g. photodiodes. The proposed semiconductor device employs an optical coupling layer which comprises an optical coupler and at least a first lateral absorber region. The lateral absorber region comprises an absorber material with a bandgap $E_g$ in the infrared, IR, e.g. in the near-infrared, NIR. For example, strained Silicon-Germanium alloy as absorber material has a bandgap $E_g$ smaller in value than the bandgap for Silicon of $E_g$=1.1 eV. The absorption bandgap can be extended into the IR, e.g. as for Si—Ge up to approximately 1250 nm. Furthermore, the optical coupler allows for deflecting incident light towards the first lateral absorber region. This effectively extends lateral absorption and provides much higher signal-to-noise in the IR compared to conventional vertically stacked photodiode concepts.

In the following, the term "infrared", or IR, refers to electromagnetic radiation having a wavelength in the range of 700 nm to 1 mm. "Near infrared", or NIR, refers to electromagnetic radiation having a wavelength in the range of 0.70 to 1.4 μm.

In at least one embodiment a semiconductor device for infrared detection comprises a stack of a first semiconductor layer, a second semiconductor layer and an optical coupling layer. The first semiconductor layer has a first type of conductivity and the second semiconductor layer has a second type of conductivity. The optical coupling layer comprises an optical coupler and at least a first lateral absorber region. The optical coupler is configured to deflect incident light towards the first lateral absorber region. The first lateral absorber region comprises an absorber material with a bandgap, e.g. in the infrared, IR, or in the near infrared, NIR.

The semiconductor device is operated as a photodiode, for example. Light which is incident of the device traverses through the second semiconductor layer and may strike the optical coupling layer. The optical coupler deflects the received light towards the first lateral absorber region. The deflected light is guided along the optical coupler and the first lateral absorber region, e.g. along a plane defined by the semiconductor layers. This way the incident light can be coupled into a depletion layer which can be formed between the semiconductor layers. Light then traverses along the first lateral absorber region and may be absorbed along the path.

Absorption process is largely determined by the material properties of the first lateral absorber region. Having a bandgap further (compared to pure Silicon) in the IR or NIR, the absorber material allows for increased absorption in the infrared and especially in the near infrared. Depending on composition of the alloy, absorption can be extended up to some 1800 nm. Furthermore, the optical coupler allows for deflecting incident light towards the lateral absorber regions. This effectively extends lateral absorption cross-section and depth, thus, increasing the absorption volume. This way sensitivity of the semiconductor device can be increased (with respect to bare Silicon) in the IR and/or NIR up to approximately 1250 nm, or more. Ultimately this leads to much higher signal-to-noise in the IR and/or NIR when compared to conventional vertically stacked photodiode concepts.

In at least one embodiment the absorber material has a bandgap, e.g. smaller in value than the bandgap for Silicon, e.g. equals 1.1 eV. The bandgap for pure or bulk Silicon reduces sensitivity of conventional semiconductor devices in the IR and NIR. Absorber materials, such as Si—Ge alloy, are available, such as Ge and GeSn, for example. These absorber materials support that the device can be used as a photodiode, e.g. a pn junction or PIN structure can be formed in the layers of the device. Furthermore, the absorber materials are compatible with semiconductor technology, such as wafer level processing and Complementary metal-oxide-semiconductor, CMOS, technology, for example.

In at least one embodiment the absorber material comprises a strained Silicon Germanium, Si—Ge, alloy. Si—Ge alloy has a characteristic bandgap $E_g$~0.66 eV which is smaller in value than the bandgap for Silicon. The bandgap lies in the near infrared, NIR. The Si—Ge alloy constitutes a layer of Silicon in which the Silicon atoms are stretched beyond their normal interatomic distance. The characteristic bandgap $E_g$ of the Si—Ge alloy can be defined during processing of the lateral absorber region. Basically, the characteristic bandgap $E_g$ depends on relative amounts of Silicon and Germanium used to form the alloy. The Si—Ge alloy can be monolithically integrated into the semiconductor device by means of epitaxial growing the alloy onto the second semiconductor layer, for example.

In embodiments of the semiconductor device various relative amounts of Silicon and Germanium can be used to form the alloy. The compositions of the alloy range between a maximum relative amount of Silicon of 100% and a minimum relative amount of Silicon of 0%. Furthermore, the Silicon Germanium alloy ranges between a maximum relative amount of Germanium of 100% and a minimum relative amount of Germanium of 0%. These relative amounts may be considered as limits and the actual compositions may lie in-between these limits. A SiGe layer typically has a transition region where the Ge content is practically very low e.g. 0% (and Si concentration is nearly 100%) or vice versa. For pure Ge there may be up to 100% Ge and 0% Si on top of an intermediate region where the Ge content changes from 100% to 0% (and Si concentration changes from 0% to 100%).

Alternatively, the Silicon Germanium alloy has a relative amount of Silicon of at least 70% and a relative amount of Germanium of at most 30%. The actual composition, i.e. relative amounts of Silicon and Germanium may depend on the intended bandgap. For example, a Si—Ge alloy with 25% Silicon and 75% Germanium provides a bandgap of 0.66 eV and a penetration depth of <50 µm for NIR. The higher the Ge content the lower the penetration depth becomes.

In at least one embodiment the optical coupler comprises a photonic grating integrated into the optical coupling layer. In addition, or alternatively, the optical coupler comprises an edge coupler.

In at least one embodiment the optical coupling layer may be part of a Silicon Germanium-on-insulator, SGOI, or Silicon-On-Insulator, SOI, wafer. The optical coupling layer may be layered between the first and second semiconductor layers. For example, the optical coupling layer can be implemented using a Silicon Germanium alloy. Furthermore, the optical coupling layer may be used as optical waveguide as well. For example, the optical coupling layer buried in the SOI or SGOI wafer enables propagation of infrared light in the semiconductor layers on the basis of total internal reflection.

In at least one embodiment the photonic grating comprises a plurality of trenches filled with a dielectric. The trenches are configured to form a photonic blaze grating. The photonic blaze grating allows for coupling incident light into the semiconductor device and direct said light towards the first lateral absorber region. The trenches can be configured to solve the grating equation for an intended wavelength of incident light.

In at least one embodiment the first type of conductivity is n-type conductivity and the second type of conductivity is p-type conductivity, or vice versa.

In at least one embodiment the optical coupling layer comprises a second lateral absorber region which is made of the absorber material. Furthermore, the optical coupler is configured to deflect incident light both towards the first and the second lateral absorber regions. Using two lateral absorber regions further extends absorption volume and sensitivity of the semiconductor device. Corresponding absorption paths can be established, e.g. guiding the incident light towards respective electrodes.

In at least one embodiment a first contact region is arranged contiguous with the first lateral absorber region to form a first electrode. In addition, or alternatively, a second contact region is arranged contiguous with the second lateral absorber region to form a second electrode. The electrodes may both be arranged at a front side of the semiconductor device, or, at least one of the electrodes, be arranged at a backside. This allows for front side or backside contacting the semiconductor device.

In at least one embodiment the grating is configured to focus deflected incident light onto the first and/or second contact region.

In at least one embodiment a backend layer is arranged on the first lateral absorber region, the second lateral absorber region and/or the optical coupling layer. The backend layer further comprises a first metallization associated with the first lateral absorber region to form the first electrode. In addition, or alternatively, a second metallization is associated with the second contact region to form the second electrode. The metallization allows for contacting and/or connecting the electrodes, respectively.

In at least one embodiment an infrared detector comprises at least one semiconductor device for infrared detection according to the concept proposed above. Furthermore, a driver circuit is implemented to operate the semiconductor device. In addition, or alternatively, a signal processor is used to process sensor signals to be generated by the semiconductor device. The infrared detector comprising the semiconductor device may be a fully integrated device with driver circuit and/or signal processor integrated on the same die.

In at least one embodiment a method of manufacturing a semiconductor device for infrared detection comprises the following steps. First, a first semiconductor layer is provided with a first type of conductivity and a second semiconductor layer is provided with a second type of conductivity. An optical coupling layer is provided with an optical coupler and a first lateral absorber region. The first semiconductor layer, the second semiconductor layer and the optical coupling layer are stacked to form the semiconductor device. The optical coupler is configured to deflect incident light towards the first lateral absorber region. The first lateral absorber region is made of an absorber material having a bandgap, e.g. in the infrared.

The method can be executed at wafer level and is compatible to manufacturing technology such as CMOS processing. For example, absorption properties can determined by the absorber material properties of the first lateral absorber region. Having a bandgap further (compared to pure Silicon) in the IR or NIR, the absorber material allows for increased absorption in the infrared and especially in the near infrared. Depending on composition of the alloy, absorption can be extended up to some 1800 nm. Furthermore, the optical coupler can be manufactured using silicon photonic technology. This effectively extends lateral absorption cross-section and depth, thus, increasing the absorption volume. This way sensitivity of the semiconductor device can be increased (with respect to bare Silicon) in the IR and/or NIR up to approximately 1250 nm, or more. Ultimately this leads to much higher signal-to-noise in the IR and/or NIR when compared to conventional vertically stacked photodiode concepts.

In at least one embodiment the first lateral absorber region is formed by means of a strained Silicon Germanium, Si—Ge, alloy. The lateral absorber region is monolithically integrated into the optical coupling layer. Si—Ge alloy has a characteristic bandgap $E_g$~0.66 eV which is smaller in value than the bandgap for Silicon. The bandgap lies in the near infrared, NIR. The Si—Ge alloy constitutes a layer of Silicon in which the Silicon atoms are stretched beyond their normal interatomic distance. The characteristic bandgap $E_g$ of the Si—Ge alloy can be defined during processing of the lateral absorber region. Basically, the characteristic bandgap $E_g$ depends on relative amounts of Silicon and Germanium used to form the alloy. The Si—Ge alloy can be monolithically integrated into the semiconductor device by means of epitaxial growing the alloy onto the second semiconductor layer, for example.

The Silicon Germanium alloy can be manufactured with various relative amount of Silicon vs. Germanium. The compositions of the alloy range between a maximum relative amount of Silicon of 100% and a minimum relative amount of Silicon of 0%. Furthermore, the Silicon Germanium alloy ranges between a maximum relative amount of Germanium of 100% and a minimum relative amount of Germanium of 0%. These relative amounts may be considered as limits and the actual compositions may lie in-between these limits. Alternatively, the Silicon Germanium alloy has a relative amount of Silicon of at least 70% and a relative amount of Germanium of at most 30%. The actual composition, i.e. relative amounts of Silicon and Germanium may depend on the intended bandgap. For example, a SI-Ge alloy with 25% Silicon and 75% Germanium provides a bandgap of 0.66 eV and a penetration depth of <50 μm for NIR.

In at least one embodiment the optical coupler is configured as a photonic grating and integrating in the optical coupling layer. This involves forming a plurality of trenches filled with an oxide, wherein the trenches are arranged to form a photonic blaze grating.

Further implementations of the method of manufacturing semiconductor device for infrared detection are readily derived from the various implementations and embodiments of the semiconductor device for infrared detection and infrared detector, and vice versa.

In the following, the concept presented above is described in further detail with respect to drawings, in which examples of embodiments are presented. In the embodiments and Figures presented hereinafter, similar or identical elements may each be provided with the same reference numerals. The elements illustrated in the drawings and their size relationships among one another, however, should not be regarded as true to scale, rather individual elements, such as layers, components, and regions, may be exaggerated to enable better illustration or a better understanding.

DETAILED DESCRIPTION

Figure 1:
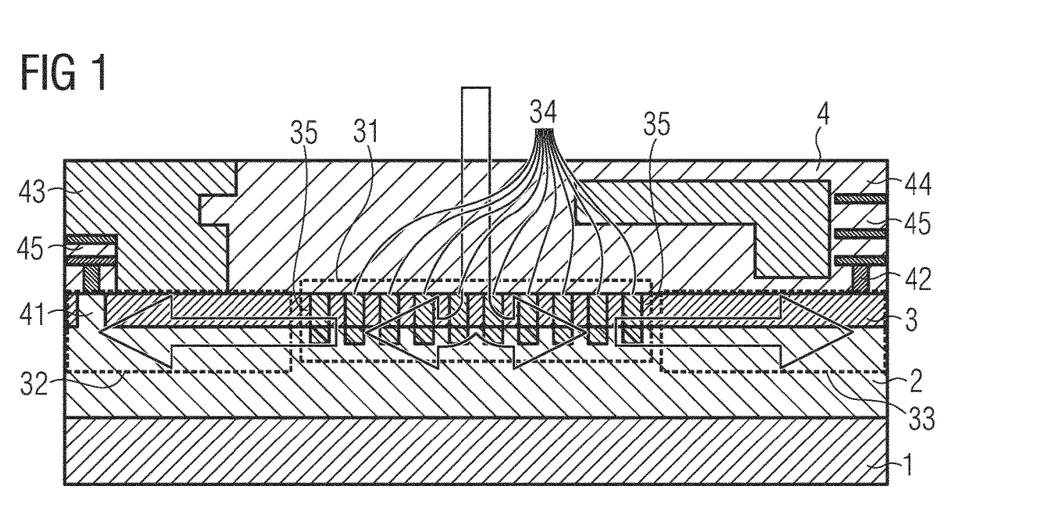
FIG. 1 shows an example embodiment of semiconductor device for infrared detection.

FIG. 1 shows an example embodiment of a semiconductor device for infrared detection. The device comprises a stack of a first semiconductor layer 1, a second semiconductor layer 2 and an optical coupling layer 3. Furthermore, a backend layer 4 is arranged on top of the stack 1, 2, 3.

The first semiconductor layer 1 has a first type of conductivity, such as n-type or p-type. In this embodiment the first semiconductor layer 1 is of p-type conductivity. For example, the first semiconductor layer is made from p-type CMOS bulk Silicon. In other embodiments (not shown) the conductivity may be reversed and the first semiconductor layer has n-type conductivity. The second semiconductor layer 2 is arranged on a main surface of the first semiconductor layer 1. The second semiconductor layer 2 has a second type of conductivity, such as n-type or p-type. In this embodiment the second semiconductor layer 2 is of n-type conductivity. For example, the second semiconductor layer is made from n-type CMOS bulk Silicon. In other embodiments (not shown) the conductivity may be reversed and the second semiconductor layer has p-type conductivity. For example, the first and second semiconductor layers are arranged as pn-junction such that a depletion region or space charge region is formed between the layers.

The optical coupling layer 3 is arranged on a main surface 21 of the second semiconductor layer 2. For example, at least in parts, the optical coupling layer 3 is contiguous with the depletion region formed between the first and second semiconductor layers. The optical coupling layer 3 comprises an optical coupler 31 and two lateral absorber regions 32, 33. The optical coupler 31 is designed as a grating coupler, or surface coupler, for vertical coupling (vertical with respect to the main surface 21 of the second semiconductor layer, for example). In other embodiments (not shown) the optical coupler can be implemented by edge couplers, inverted taper or adiabatic couplers, for instance. The grating coupler further comprises trenches 33, which are filled with a dielectric material, e.g. an oxide. The trenches are arranged to form a photonic grating (see FIGS. 4A to 4C). In this embodiment the photonic grating forms a photonic Blaze grating. The individual trenches constitute lines of the grating and are spaced apart with a line spacing according to the grating equation. For example, considering a wavelength of 1300 nm (NIR) the trenches are spaced apart by some 325 nm.

Two lateral absorber regions 32, 33 flank the optical coupler 31. The optical coupler 31 has two output sides 35 which are coupled to and facing the lateral absorber regions 32, 33, respectively. The lateral absorber regions 32, 33 are made of an absorber material with a characteristic bandgap $E_g$ in the infrared, IR. For example, the absorber material comprises a strained Silicon Germanium, Si—Ge, alloy and has a bandgap $E_g$ which is smaller in value than the bandgap for Silicon of $E_g$=1.1 eV. In other words, in this embodiment the bandgap lies in the near infrared, NIR. The lateral absorber regions made from the Si—Ge alloy constitute layers of Silicon in which the Silicon atoms are stretched beyond their normal interatomic distance. The strain present in the layer constrains the feasible layer thickness, which lies at some 150 nm, for example. Larger layer thickness, however, may relax the Si—Ge alloy. The characteristic bandgap $E_g$ of the Si—Ge alloy can be defined during processing of the lateral absorber regions. Basically, the characteristic bandgap $E_g$ depends on relative amounts of Silicon and Germanium used to form the alloy. Further details will be discussed with respect to FIG. 2. The Si—Ge alloy can be monolithically integrated into the semiconductor device by means of epitaxial growing the alloy onto the second semiconductor layer, for example.

Furthermore, the semiconductor device comprises the backend layer 4, e.g. a CMOS backend layer, which is arranged on the second semiconductor layer 2, i.e. the backend layer 4 covers a main surface of the second semiconductor layer 2. A first contact region 41 and a second contact region 42 are arranged in the backend layer 4. In fact, the first contact region 41 is contiguous with the first lateral absorber region 32 and forms a first electrode 43. The second contact region 42 is contiguous with the second lateral absorber region 33 and forms a second electrode 44. The electrodes 43, 44 are connected to a metallization layer 45 in the backend layer 4 which allows for electrically contacting the semiconductor device. The backend layer 4 may include further contacts, insulating layers (dielectrics), metal levels, and bonding sites for chip-to-package connections etc. The backend layer 4 is made from a material which is at least partly transparent in the IR or NIR.

The semiconductor device is operated as a photodiode, for example. Light which is incident of the device traverses through the backend layer 4 and eventually strikes the optical coupling layer 3. The optical coupler receives the incident light and deflects the received light, by means of diffraction by the photonic grating, deflects towards the lateral absorber regions 32, 33. For example, light is guided into a plane defined by the semiconductor layers, e.g. parallel to said plane. This way the incident light is coupled into the depletion layer formed by the semiconductor layers. Light then traverses along the lateral absorber regions 32, 33 and eventually gets absorbed along the path.

Absorption process is largely determined by the material properties of the lateral absorber regions 32, 33. As strained Silicon-Germanium alloy is used as absorber material there is increased absorption in the infrared and especially in the near infrared. The bandgap $E_g$ is in the range of 0.66 eV, and, thus, smaller in value than the bandgap for Silicon ($E_g$=1.1 eV). Consequently, the absorption bandgap can be extended into the IR, e.g. as for Si—Ge up to approximately 1250 nm. Depending on composition of the alloy, absorption can be extended up to some 1800 nm. Furthermore, the optical coupler, i.e. photonic grating in this embodiment, allows for deflecting incident light towards the lateral absorber regions. This effectively extends lateral absorption cross-section and depth, thus, increasing the absorption volume. Using Si—Ge alloy as material for the lateral absorption regions increases sensitivity (with respect to bare Silicon) in the IR and/or NIR up to approximately 1250 nm, or more. Ultimately this leads to much higher signal-to-noise in the IR and/or NIR when compared to conventional vertically stacked photodiode concepts.

In other embodiments (not shown) the first and second semiconductor layers may be arranged in different ways. For example, the two semiconductor layers may be embedded in an epilayer. Furthermore, the two layers may be stacked in a vertical fashion as discussed above, or horizontally, side-by-side. Instead of forming a pn-junction the semiconductor layers may form a PIN junction with an intrinsic region in-between the layers and the depletion region exists almost completely within the intrinsic region. This way the semiconductor device can be operated as a PIN photodiode. Instead of contacting the semiconductor device from the front-side, which is exposed to incident light, contacting may also be implemented from a backside of the first semiconductor layer, e.g. by means of solder balls and a redistribution layer.

Figure 2:
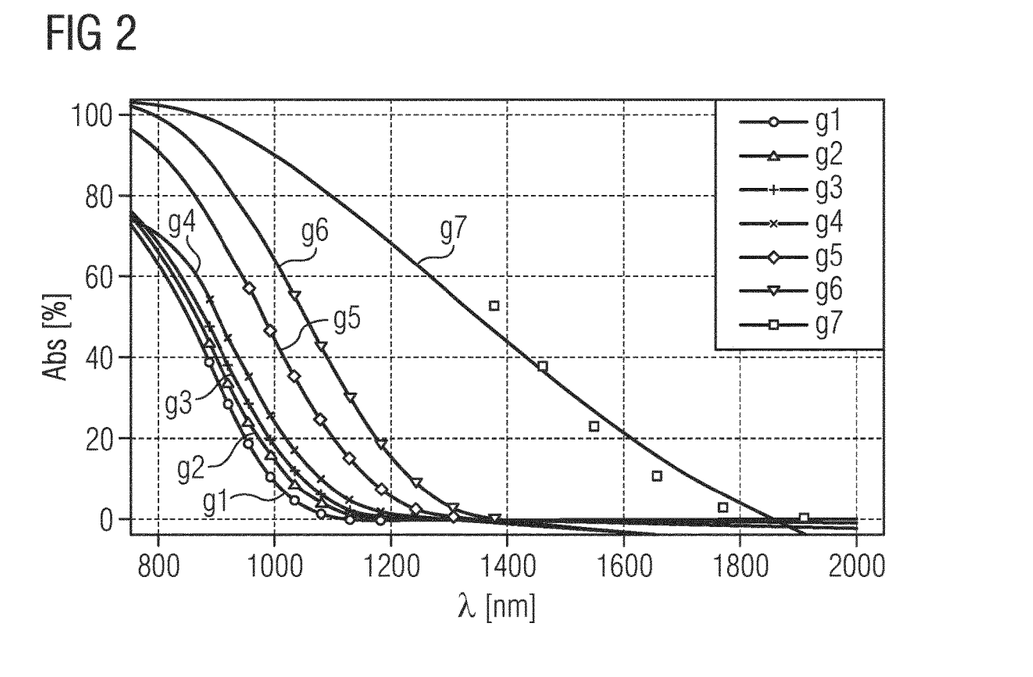
FIG. 2 shows examples of Silicon-Germanium alloy composition.

FIG. 2 shows examples of Silicon-Germanium composition. The drawing depicts absorbance Abs (in units of %) as a function of wavelength A (in units of nm). Six graphs are shown which represent different relative amounts of Silicon and Germanium, respectively. Graphs g1 and g7 show pure Silicon and pure Germanium as a reference, respectively. For example, graph g1 indicates the bandgap $E_g$ of Silicon as absorbance approximately reaches zero for $\lambda$>1100 nm. Pure Germanium, however, has non-zero absorbance at 1100 nm up to approximately 1850 nm. The following table gives an overview of the relative amounts represented by the graphs g1 to g7.

| graph | Si [in %] | Ge [in %] |
|---|---|---|
| g1 | 100 | 0 |
| g2 | 90 | 10 |
| g3 | 80 | 20 |
| g4 | 70 | 30 |
| g5 | 50 | 50 |
| g6 | 25 | 75 |
| g7 | 0 | 100 |

The graphs show that with increasing relative amount of Germanium, Ge, the bandgap of the Si—Ge alloy is shifted further into the IR. Absorbance has been measured in 10 μm bulk of Si(1-x)Ge(x) and Ge, wherein x represents the relative amount of Si and Ge. A relative amount of Si of 70% to 80% and a corresponding relative amount of Ge of 30% to 40% has been found suitable for a number of NIR applications.

Figure 3:
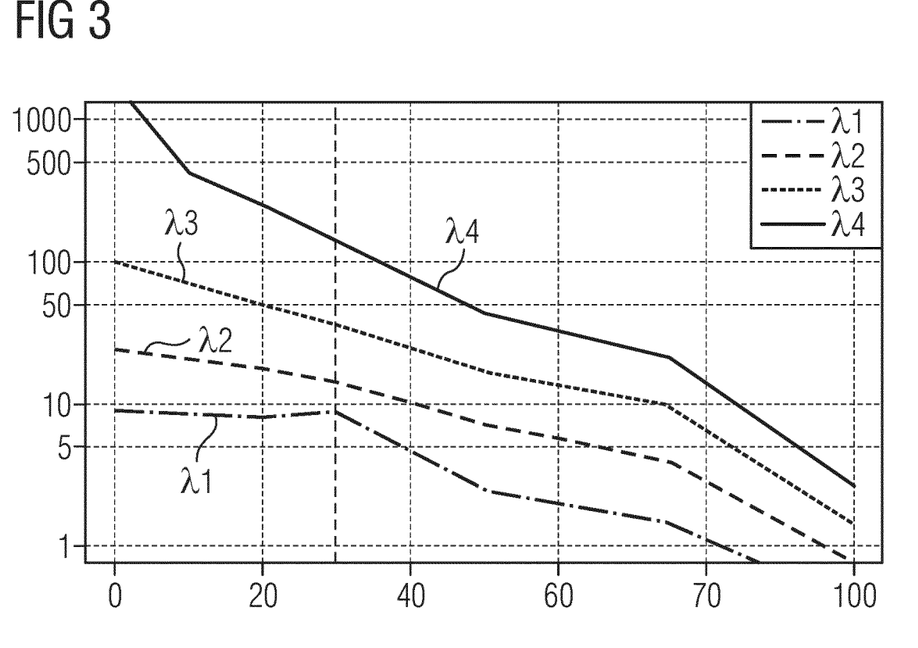
FIG. 3 shows penetration depths of examples of Silicon-Germanium alloy compositions.

FIG. 3 shows penetration depths of examples of Silicon-Germanium alloy compositions. The drawing depicts penetration depth (in units of μm) for various wavelength $\lambda$ (in units of nm) of incident light as a function of alloy composition Si(1-x)Ge(x). Four wavelengths are depicted: $\lambda 1$=800 nm, $\lambda 2$=900 nm, $\lambda 3$=1000 nm, and $\lambda 4$=1100 nm. The dashed line in the drawing indicates the alloy composition of graph g6 with 25% relative amount of Si and 75% relative amount of Ge. It is apparent that Si—Ge alloys with higher relative amounts of Ge provide increasing penetration depth for NIR light, effectively increasing the absorption volume of the lateral absorber regions.

Figure 4A:
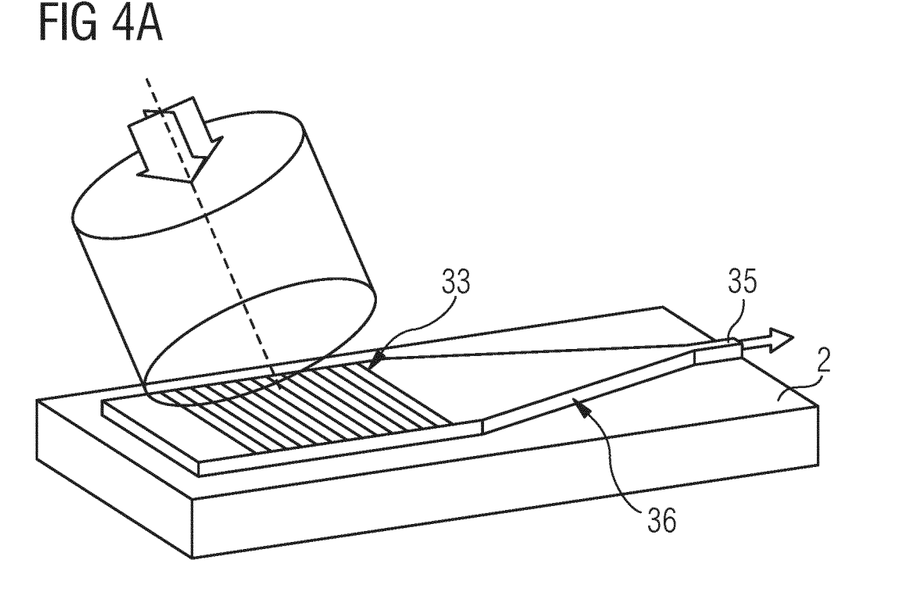
FIGS. 4A to 4C show examples of an optical coupling layer.
Figure 4B:
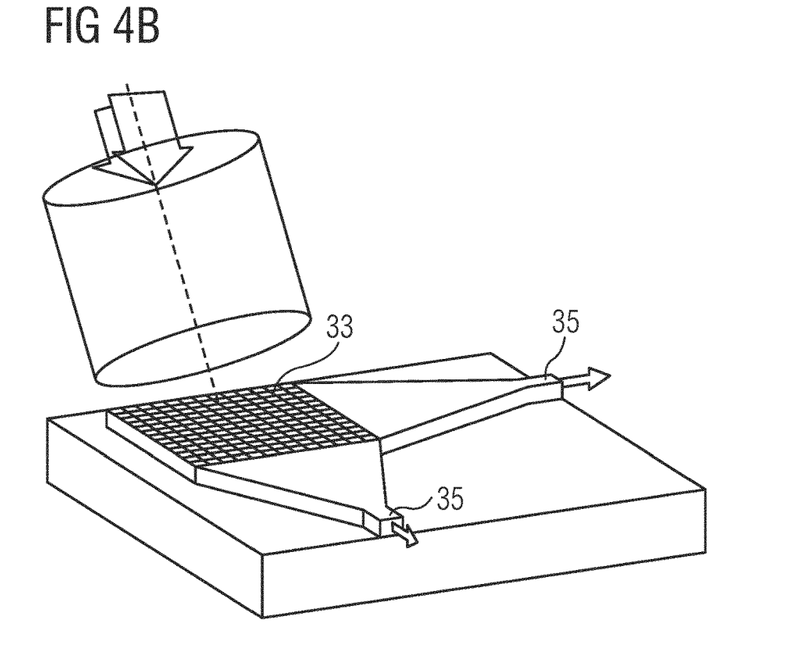
Figure 4C:
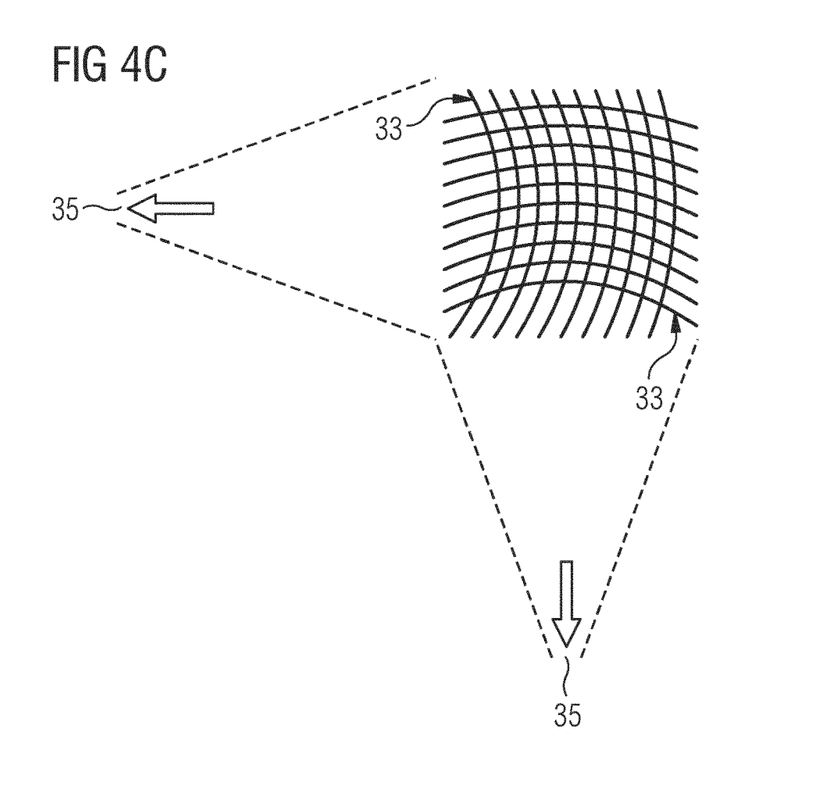

FIGS. 4A to 4C show examples of the optical coupling layer. The optical coupler is arranged as photonic grating having a plurality of trenches 33 which are filled with a dielectric, e.g. an oxide. The drawing shows the trenches 33 in top view. The trenches are configured to form a photonic blaze grating which obeys the grating equation. For example, the trenches are arranged in a plane with a constant line spacing. The trenches forming the grating are coupled to a tapered region 36, such as an adiabatic taper, which forms part of an output side 35 of the photonic blaze grating. The lateral absorption regions (not shown) are coupled to a respective output side 35 of the photonic blaze grating in order to receive light from the grating. The incident light (indicated by the arrows in the drawings) is deflected towards to the output side 35 by means of diffraction. Typically, the transverse mode of the incident is guided towards the output side 35. The optical coupler may be integrated into the semiconductor layers, there by forming a fully integrated semiconductor device for infrared detection. In other embodiments the optical coupler may be attached to the semiconductor layers. FIG. 4A shows an optical coupler with one output side. FIG. 4B shows an optical coupler with a dual tilted design and two output sides, respectively. FIG. 4C shows an optical coupler with curved trenches. Curvature of the trenches is configured to focus deflected incident light, e.g. onto the first and/or second contact regions.

The invention claimed is:
1. A semiconductor device for infrared detection, comprising a stack of a first semiconductor layer, a second semiconductor layer and an optical coupling layer, wherein:
the first semiconductor layer has a first type of conductivity and the second semiconductor layer has a second type of conductivity,
the optical coupling layer comprises an optical coupler and at least a first lateral absorber region,
the optical coupler is configured to deflect incident light towards the first lateral absorber region, and
the first lateral absorber region comprises an absorber material with a bandgap $E_g$ in the infrared, IR and wherein the first lateral absorber region has a thickness of about 150 nm, wherein
the absorber material has a bandgap $E_g$ smaller in value than the bandgap for silicon of $E_g=1.1$ eV and ranges up at most to 1250 nm,
the absorber material comprises a strained silicon germanium, Si—Ge, alloy, and the bandgap $E_g$ is defined by a relative amount of silicon of at least 70% and a relative amount of germanium of at most 30%.
2. The semiconductor device according to claim 1, wherein
the optical coupler comprises a photonic grating integrated into the optical coupling layer, and/or
the optical coupling layer is part of a Silicon Germanium-on-insulator, SGOI, or Silicon-On-Insulator, SOI, wafer.
3. The semiconductor device according to claim 2, wherein
the photonic grating comprises a plurality of trenches filled with a dielectric, and
the trenches are configured to form a photonic Blaze grating.
4. The semiconductor device according to claim 1, wherein the first type of conductivity is n-type conductivity and the second type of conductivity is p-type conductivity, or vice versa.
5. The semiconductor device according to claim 1, wherein
the optical coupling layer comprises a second lateral absorber region made of the absorber material, and
the optical coupler is configured to deflect incident light both towards the first and the second lateral absorber region.
6. The semiconductor device according to claim 5, comprising at least one contact region
which is arranged contiguous with one of the first and second lateral absorber regions to form at least one of a first and a second electrode,
wherein
the optical coupler comprises a grating, which is configured to focus deflected incident light onto the at least one contact region.
7. The semiconductor device according to claim 6, wherein
a backend layer is arranged on the first lateral absorber region, the second lateral absorber region and/or the optical coupling layer, and the backend layer further comprises:
a first metallization associated with the first lateral absorber region to form the first electrode, and/or
a second metallization associated with the second contact region to form the second electrode.
8. An infrared detector, comprising:
at least one semiconductor device for infrared detection according to claim 1, and
a driver circuit to operate the semiconductor device, and/or
a signal processor to process sensor signals to be generated by the semiconductor device.
9. The semiconductor device according to claim 1, wherein the first semiconductor layer and the second semiconductor layer are arranged as p-n junction such that a depletion region or space charge region is formed between the layers.
10. The semiconductor device according to claim 1, wherein the optical coupling layer is arranged on a main surface of the second semiconductor layer.
11. A method of manufacturing semiconductor device for infrared detection, comprising:
providing a first semiconductor layer with a first type of conductivity and a second semiconductor layer with a second type of conductivity,
providing an optical coupling layer with an optical coupler and a first lateral absorber region,
stacking the first semiconductor layer, second semiconductor layer and optical coupling layer to form the semiconductor device; wherein:
the optical coupler is configured to deflect incident light towards the first lateral absorber region, and
the first lateral absorber region is made of an absorber material with a bandgap $E_g$ in the infrared, IR, wherein the first lateral absorber region has a thickness of about 150 nm, wherein
the absorber material has a bandgap $E_g$ smaller in value than the bandgap for silicon of $E_g=1.1$ eV and ranges up at most to 1250 nm,
the absorber material comprises a strained silicon germanium, Si—Ge, alloy, and the bandgap $E_g$ is defined by a relative amount of silicon of at least 70% and a relative amount of germanium of at most 30%.
12. The method according to claim 11, wherein the first lateral absorber region is monolithically integrated into the optical coupling layer.
13. The method according to claim 11, wherein the optical coupler is configured as a photonic grating and integrated in the optical coupling layer involving forming plurality of trenches filled with an oxide, the trenches are arranged to form a photonic Blaze grating.

14. A semiconductor device for infrared detection, comprising a stack of a first semiconductor layer, a second semiconductor layer and an optical coupling layer, wherein:
- a backend layer is arranged on top of the stack,
- the first semiconductor layer has a first type of conductivity,
- the second semiconductor layer is arranged on a main surface of the first semiconductor layer and has a second type of conductivity,
- the optical coupling layer is arranged on a main surface of the second semiconductor layer, wherein, at least in parts, the optical coupling layer is contiguous with a depletion region formed between the first and second semiconductor layers,
- the optical coupling layer comprises an optical coupler and two lateral absorber regions, wherein the two lateral absorber regions flank the optical coupler,
- the two lateral absorber regions are made of an absorber material with a characteristic bandgap $E_g$ in the infrared, IR,
- the optical coupler has two output sides, which are coupled to and facing the lateral absorber regions, respectively,
- wherein light which is incident on the device traverses through the backend layer.

15. The semiconductor device according to claim 14, wherein the absorber material comprises a strained Silicon Germanium, Si—Ge, alloy and has a bandgap $E_g$ which is smaller in value than the bandgap for Silicon of $E_g=1.1$ eV.

16. The semiconductor device according to claim 14, wherein:
- the optical coupler is designed as a grating coupler, or surface coupler,
- the grating coupler further comprises trenches, which are filled with a dielectric material, such as an oxide, and
- the trenches are arranged to form a photonic grating.

17. The semiconductor device according to claim 14, wherein the absorber material comprises a strained Silicon Germanium, Si—Ge, alloy having
- a maximum relative amount of Si of 100% and a minimum relative amount of Si of 0%, and
- a maximum relative amount of Ge of 100% and a minimum relative amount of Ge of 0%.

* * * * *